(12) United States Patent
Niino

(10) Patent No.: US 9,756,731 B2
(45) Date of Patent: Sep. 5, 2017

(54) PACKAGE FOR HOUSING ELECTRONIC COMPONENT AND ELECTRONIC DEVICE

(71) Applicant: KYOCERA Corporation, Kyoto-shi, Kyoto (JP)

(72) Inventor: Noritaka Niino, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 178 days.

(21) Appl. No.: 14/758,334

(22) PCT Filed: Feb. 25, 2014

(86) PCT No.: PCT/JP2014/054590
§ 371 (c)(1),
(2) Date: Jun. 29, 2015

(87) PCT Pub. No.: WO2014/129666
PCT Pub. Date: Aug. 28, 2014

(65) Prior Publication Data
US 2015/0334845 A1    Nov. 19, 2015

(30) Foreign Application Priority Data

Feb. 25, 2013  (JP) ................................ 2013-034689

(51) Int. Cl.
*H05K 1/18*   (2006.01)
*H05K 1/03*   (2006.01)
(Continued)

(52) U.S. Cl.
CPC ........... *H05K 1/185* (2013.01); *H01L 23/057* (2013.01); *H01L 23/26* (2013.01); *H05K 1/0296* (2013.01);
(Continued)

(58) Field of Classification Search
CPC .... H05K 1/185; H05K 1/0296; H05K 1/0306; H01L 23/057; H01L 23/26
See application file for complete search history.

(56) References Cited

U.S. PATENT DOCUMENTS 5,561,321 A * 10/1996 Hirano .................... B32B 15/01
257/700
5,921,461 A * 7/1999 Kennedy .............. G01D 11/245
228/124.6
(Continued)

FOREIGN PATENT DOCUMENTS

IT    EP 0275844 A2 * 7/1988 ................ H01J 7/18
JP    1978-128291 A    11/1978
(Continued)

OTHER PUBLICATIONS

Extended European Search Report, European Patent Application No. 14753751.8, Sep. 14, 2016, 10 pgs.
(Continued)

*Primary Examiner* — Nathan Milakovich
(74) *Attorney, Agent, or Firm* — Volpe and Koenig, P.C.

(57) ABSTRACT

A package for housing an electronic component, which is provided with: a substrate part that comprises an insulating substrate, which is formed of a ceramic sintered body and comprises a recess portion, and a wiring conductor which is provided on the insulating substrate; and a metal portion which is formed of a sintered body of a getter metal material and is directly bonded to the recess portion.

12 Claims, 4 Drawing Sheets

(51) Int. Cl.
  *H01L 23/26* (2006.01)
  *H05K 1/02* (2006.01)
  *H01L 23/057* (2006.01)

(52) U.S. Cl.
  CPC .. *H05K 1/0306* (2013.01); *H01L 2224/16225* (2013.01); *H01L 2224/32225* (2013.01); *H01L 2224/48091* (2013.01); *H01L 2224/48227* (2013.01); *H01L 2224/49171* (2013.01); *H01L 2224/73204* (2013.01); *H01L 2224/73265* (2013.01); *H01L 2924/1461* (2013.01)

(56) References Cited

U.S. PATENT DOCUMENTS

| | | | | |
|---|---|---|---|---|
| 5,929,515 | A * | 7/1999 | Greiff | H01L 23/26 257/682 |
| 6,191,529 | B1 * | 2/2001 | Park | H01J 11/12 313/553 |
| 6,652,343 | B2 * | 11/2003 | Hasegawa | H01J 9/385 445/25 |
| 6,897,551 | B2 * | 5/2005 | Amiotti | B81C 1/00285 257/682 |
| 6,923,625 | B2 * | 8/2005 | Sparks | B32B 9/00 252/181.5 |
| 6,992,375 | B2 * | 1/2006 | Robbins | B81B 7/0038 156/345.43 |
| 7,042,075 | B2 * | 5/2006 | Liebeskind | B81B 7/0038 257/682 |
| 7,042,076 | B2 * | 5/2006 | Geosling | B81C 1/00285 257/682 |
| 7,160,368 | B1 * | 1/2007 | Wakelin | B01J 20/041 257/99 |
| 7,193,364 | B2 * | 3/2007 | Klausmann | H01J 51/5259 313/504 |
| 7,413,814 | B2 * | 8/2008 | Conte | B32B 15/01 252/181.1 |
| 7,660,495 | B2 * | 2/2010 | Hirose | H01L 23/26 313/561 |
| 7,871,660 | B2 * | 1/2011 | Moraja | B81C 1/00285 252/181.1 |
| 8,040,587 | B2 * | 10/2011 | Palmateer | B81B 7/0038 359/290 |
| 8,400,050 | B2 * | 3/2013 | Onitsuka | H03H 9/1021 310/370 |
| 8,410,861 | B2 * | 4/2013 | Fukuda | H03H 3/02 310/370 |
| 8,514,029 | B2 * | 8/2013 | Fukuda | H03H 3/02 310/370 |
| 8,633,775 | B2 * | 1/2014 | Yamaguchi | H03H 3/04 29/25.35 |
| 9,157,805 | B2 * | 10/2015 | Yamazaki | G01J 5/045 |
| 9,327,963 | B2 * | 5/2016 | Baillin | B81B 7/0038 |
| 2005/0085053 | A1 | 4/2005 | Chen et al. | |
| 2005/0253283 | A1 * | 11/2005 | DCamp | B65D 81/2038 257/787 |
| 2007/0013305 | A1 * | 1/2007 | Wang | B01J 20/183 313/553 |
| 2007/0205720 | A1 * | 9/2007 | Sparks | F04B 37/04 313/553 |
| 2009/0065049 | A1 * | 3/2009 | Son | H01J 7/183 136/256 |
| 2011/0156190 | A1 * | 6/2011 | Mori | G01J 1/0252 257/433 |
| 2012/0193534 | A1 * | 8/2012 | Perratone | G01J 5/045 250/330 |
| 2013/0186945 | A1 * | 7/2013 | Miyao | H05K 13/04 228/221 |
| 2014/0022718 | A1 * | 1/2014 | Yamazaki | G01J 5/029 361/679.01 |
| 2016/0105980 | A1 * | 4/2016 | Mori | H01L 23/10 361/728 |

FOREIGN PATENT DOCUMENTS

| | | | |
|---|---|---|---|
| JP | 1996-236660 A | | 9/1996 |
| JP | 2000-227920 A | | 8/2000 |
| JP | 2003-254820 A | | 9/2003 |
| JP | 2003254820 A | * | 9/2003 |
| JP | 2006-086585 A | | 3/2006 |
| JP | 2007251238 A | * | 9/2007 |
| JP | 2010-040767 A | | 2/2010 |
| JP | 2011-203194 A | | 10/2011 |
| JP | 2014090118 A | * | 5/2014 |
| WO | 2010/010721 A | | 1/2010 |
| WO | 2013/008919 A | | 1/2013 |

OTHER PUBLICATIONS

International Search Report (Form PCT/ISA/210) mailed on Apr. 8, 2014 and issued for PCT/JP2014/054590.

* cited by examiner

PACKAGE FOR HOUSING ELECTRONIC COMPONENT AND ELECTRONIC DEVICE

TECHNICAL FIELD

The present invention pertains to a package for housing an electronic component for hermetically sealing an electronic component, such as an acceleration sensor element, an infrared sensor element, a gyro sensor, a crystal resonator, a surface acoustic wave element, and a micro electro-mechanical systems (MEMS) element, and to an electronic device.

BACKGROUND

An electronic device is manufactured by hermetically sealing an electronic component, such as an acceleration sensor element, an infrared sensor element, a gyro sensor, a crystal resonator, a surface acoustic wave element, and a MEMS element, within a housing part of a package for housing an electronic component. The electronic device is used as a component in various types of electronic equipment, such as an in-vehicle detector, an infrared detector, or a mobile terminal. In such an electronic device, a reduction in the amount of gas molecules present within the housing part in which the electronic component is hermetically sealed is sought in order to improve protection and functionality of the above-described electronic component.

Providing a getter material within the housing part is a known approach used in order to reduce the amount of gas molecules. The gas molecules present within the housing part are adsorbed by the getter material. As such, this getter material enables the amount of gas molecules present within the housing part to be reduced.

The getter material is, for example, provided as a component bonded to a metal plate or the like, which is made of metal grains that adsorb gasses and have been heated. The metal grains serving as the getter material are mutually bonded at a contact boundary. In addition, the metal grains, the metal plate, and the like are mutually bonded at the contact boundary. The metal plate is bonded to the housing part of the package for housing the electronic component by a bonding material, such as glass.

PRIOR ART DOCUMENT

Patent Document

Patent Document 1: Japanese Unexamined Patent Application Publication No. H8-236660A
Patent Document 2: Japanese Unexamined Patent Application Publication No. 2003-254820
Patent Document 3: Japanese Unexamined Patent Application Publication No. 2000-227920

SUMMARY OF THE INVENTION

Problem to be Solved by the Invention

However, in the package for housing the electronic component and the electronic device of the above-described conventional technology, bonding occurs only between the metal grains and between the metal grains and the metal plate or the like at the contact boundary. As such, the strength of bonding is comparatively small. As a result, there has been a problem in that the metal grains serving as the getter material provided on the inner surface of the housing part in the package for housing the electronic component are at risk of peeling away and falling off. Then, there is a risk that the getter material (metal particles) that has fallen or peeled away may cause an electrical short between electrodes of the electronic component, or may cause electrical shorts or the like between the electrodes of the electronic component and the wiring conductor or the like provided in the package for housing the electronic component.

Particularly, in recent years, as miniaturization, high-density advancement, and the like are progressing in electronic components, failures such as the above-described shorts have become more prone to occurring because of minute amounts of peeled (fallen or the like) metal particles from the getter material.

Means to Solve the Problem

The package for housing the electronic component of one aspect of the present invention includes a substrate part including an insulating substrate made from a ceramic sintered body that includes a recess portion, and a wiring conductor provided on the insulating substrate. The package also includes a metal portion made from a sintered body of a getter metal material directly bonded to the recess portion.

The electronic device according to one aspect of the present invention includes a package for housing an electronic component having the above-described configuration, and has an electronic component housed within the recess portion.

Effect of the Invention

According to the package for housing the electronic component of one aspect of the present invention, the strength of the sintered body itself, being made from the getter metal material and forming the metal portion, as well as the bonding strength between the metal portion and the recess portion, are large in comparison to conventional technology. As a result, a piece of the metal portion (the getter metal material) is effectively prevented from crumbling, or from peeling away.

According to the electronic device of one aspect of the present invention, given that the package for housing the electronic component having the above-described configuration is used, a piece of the metal portion is effectively prevented from crumbling, or from peeling away. As a result, the gas molecules within the recess portion may be adsorbed by the metal portion, which enables the electronic device to be provided with high long-term reliability in terms of electronic performance.

BEST MODE FOR CARRYING OUT THE INVENTION

A package for housing an electronic component and an electronic device pertaining to embodiments of the present invention are described below, with reference to the accompanying drawings. In the following drawings, hatching is applied in part to drawings that are not cross-sectional views for the purpose of identification, in some cases.

First Embodiment

Figure 1A:
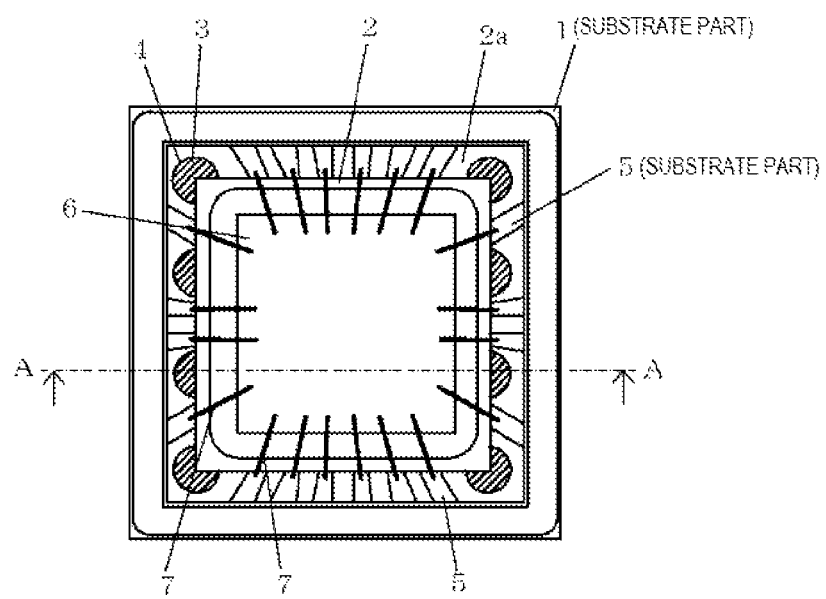
FIG. 1A is a plan view illustrating a package for housing an electronic component and an electronic device of a first embodiment of the present invention.
Figure 1B:
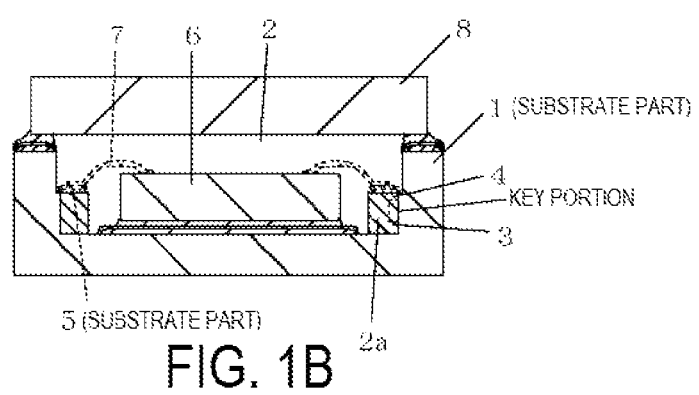
FIG. 1B is a cross-sectional view taken along line A-A of FIG. 1A.

FIG. 1A is a plan view illustrating the package for housing an electronic component and the electronic device of the first embodiment of the present invention. FIG. 1B is a cross-sectional view taken along line A-A of FIG. 1A. The package for housing the electronic component has a basic configuration of an insulating substrate 1 that includes a recess portion 2, wiring conductors 5 that are provided on the insulating substrate 1, and metal portions 3 that are directly bonded to the inside of the recess portion 2. Here, the later-described lid are omitted from FIG. 1A in order to facilitate visibility.

The insulating substrate 1 is, for example, shaped as a quadrilateral (a rectangular shape). As described above, the insulating substrate 1 has a top face that includes the recess portion 2. In the package for housing the electronic component of the first embodiment, an inner surface of the recess portion 2 has cavity portions 4. The metal portion 3 is provided within the cavity portion 4.

In addition, the recess portion 2 includes a side face and a bottom face constituting the inner surface. The side face has a step-shaped portion 2a. Further, the wiring conductor 5 is provided on a top face of the step-shaped portion 2a. The wiring conductor 5 is formed by a metallization layer that is provided on the top face of the step-shaped portion 2a. A substrate part of the package for housing the electronic component is configured by the insulating substrate 1 and the wiring conductors 5.

As illustrated in FIGS. 1A and 1B, the cavity portions 4 are located on the side face of the step-shaped portion 2a. In this example, the cavity portion 4 is a groove-shaped portion formed so as to extend in a vertical direction along the side face of the step-shaped portion 2a.

The recess portion 2 of the insulating substrate 1 is a portion forming part of a container for hermetically sealing an electronic component 6. For example, after the electronic component 6 is housed in the recess portion 2 and is electrically connected to the wiring conductors 5 via a conductive material 7, by closing the recess portion 2 with a lid 8, the electronic component 6 is hermetically sealed within the container made up of the recess portion 2 and the lid 8. An electronic device is formed by mounting the electronic component 6 in the package for housing the electronic component. The recess portion 2 has a quadrilateral shape, for example, as seen in a plan view.

The insulating substrate 1 is, for example, formed from a ceramic material such as an aluminum oxide-based sintered body, a glass ceramic sintered body, a mullite-based sintered body, or an aluminum nitride-based sintered body. In addition, the insulating substrate 1 may also be formed from a resin material such as an epoxy resin or a polyimide resin, or may be formed from a composite material combining a resin material and an inorganic filler.

In a situation where the insulating substrate 1 is formed from the aluminum oxide-based sintered body, for example, then a manufacturing method such as a ceramic green sheet laminating method may be used for manufacturing. That is, a plurality of ceramic green sheets is created by forming a raw material powder, such as aluminum oxide and silicon oxide, combined with an additive such as an organic binder, into a sheet shape. Manufacturing may then proceed by laminating these sheets and firing. In such a situation, forming one of the ceramic green sheets that is laminated on the top portion into a frame shape by a method such as punching processing enables the insulating substrate 1 to be manufactured with the recess portion 2 on the top face.

In this situation, a subset of the ceramic green sheets among the plurality of ceramic green sheets is formed into a frame shape using the method such as punching processing. Then, laminating the frame shaped ceramic green sheet on the top portion enables the insulating substrate 1 to be manufactured having the recess portion on the top face. In addition, manufacturing a plurality of frame shaped ceramic green sheets that differs from each other in terms of the inner circumference dimension (the size of the punched out portion) and laminating the sheets such that a sheet having the smallest inner circumference dimension is on the bottom enables the recess portion 2 to be formed having the step-shaped portion 2a on the side face.

The recess portion 2 of the insulating substrate 1 is a portion housing the electronic component 6, as described above. For this reason, the recess portion 2 is provided with a shape and dimensions (size as seen in a plan view, depth, and the like) that are appropriate to the shape and dimensions of the electronic component 6. This electronic component 6 may be, for example, an acceleration sensor element, an infrared sensor element, a gyro sensor, a piezoelectric element (including a crystal resonator), and the like. These examples of the electronic component 6 each have a micro electronic mechanical mechanism on a surface of a semiconductor substrate, and may thus be termed a micro electro-mechanical systems (MEMS) element.

The metal portion 3 serves to adsorb any gas molecules present within the above-described container that includes the recess portion 2. The metal portion 3 is formed from a sintered body of getter metal material that is directly bonded to the recess portion 2. Providing the metal portion 3 improves the vacuum degree within the container and improves the reliability, functionality, and the like of the electronic component 6 hermetically sealed within the container. The gas molecules within the container adsorbed by the metal portion 3 may be gasses produced by materials forming the electronic device, such as the insulating substrate 1 and the lid 8, during manufacturing and usage of the electronic device, or may be water (H₂O) or the like infiltrating the electronic component from outside during manufacturing.

The metal portion 3 is, for example, formed by simultaneous firing of a metal paste with the insulating substrate 1 (the laminated body of the plurality of ceramic green sheets). The details of the metal portion 3 are described below.

The wiring conductor 5 is, for example, a conducting path serving to electrically connect the electronic component 6 to an external electric circuit (not illustrated). For this reason, the wiring conductor 5 has a portion that is electrically connected to the electronic component 6. The wiring conductor 5 in the package for housing the electronic component of the first embodiment has one end positioned within the recess portion 2. The electronic component 6 is electrically connected at the one end via the conductive material 7. A portion of the wiring conductor 5 other than the one end (for example, another end) (not illustrated) is electrically lead to an outer surface that is a side face, a bottom face, or the like of the insulating substrate 1. This portion is electrically connected to an outside electric circuit. As a result, the electronic component 6 that is hermetically sealed and housed within the recess portion 2 is electrically connected to the outside electric circuit. In addition to the portions illustrated in FIGS. 1A and 1B, such a wiring conductor 5 may also include an internal conductor (not illustrated) such as an internal wiring and a via conductor inside the insulating substrate 1.

The wiring conductor 5 is made of a metallization layer formed by a metal material such as tungsten, molybdenum, manganese, copper, silver, palladium, platinum, gold, nickel, cobalt, or titanium. In addition to the metallization layer, these metal materials are, for example, deposited onto the surface of the insulating substrate 1 in the form of a plated layer, a deposited layer, or similar.

In a situation where the wiring conductor 5 includes a metallization layer of tungsten, a metal paste created by kneading a metal powder of tungsten with an organic solvent, a binder, and the like is printed onto the surface of the ceramic green sheets constituting the insulating substrate 1 using a method such as a screen printing method. The wiring conductor 5 is then formed by simultaneous firing.

The package for housing the electronic component of the first embodiment has the step-shaped portion 2a on the side face of the recess portion 2, as described above. The wiring conductors 5 are provided on the top face of the step-shaped portion 2a. Given that the wiring conductors 5 are provided on the top face of the step-shaped portion 2a, a connection portion (an electrode or the like) of the electronic component 6, provided on the top face of the electronic component 6, for example, and the wiring conductor 5 are close to each other. This closer position facilitates electrical connection between the two components and reduces the electrical resistance.

In the example of this embodiment, a bonding wire is used as the conductive material 7. The bonding wire is made from gold, aluminum, or the like, and is connected to the wiring conductor 5 and to the electronic component 6 (the electrode or the like) by one of wedge bonding and ball bonding.

The lid 8 is bonded to the insulating substrate 1 through a bonding material (no reference sign). The bonding material may use a metal material such as gold, silver, zinc, tin, or copper, as well as an alloy of these metal materials, as a main component.

The lid 8 is, for example, made from an insulating material such as a ceramic material or a glass material, from a metal material, or from silicon. In a situation where the lid 8 is made from an insulating material, a bonding surface of the lid 8 with respect to the insulating substrate 1 preferably has a metallization layer (not illustrated) formed thereon. In such a situation, the metallization layer (no reference sign) is also provided on a portion of the top surface of the insulating substrate 1 where the lid 8 is joined. In a situation where the lid 8 is made from a ceramic material, an aluminum oxide-based sintered body, a mullite-based sintered body, or the like is used, for example.

The package for housing the electronic component of the first embodiment has the metal portions 3 provided in the recess portion 2, as described above. The metal portions 3 are positioned within the cavity portion 4. In other words, the metal portion 3 is inside the recess portion 2. The metal portion 3 is formed from a sintered body of a getter metal material that is directly bonded to the inner surface of the recess portion 2. In addition, for the package for housing the electronic component and the electronic device of the first embodiment, as described above, the metal portions 3 are provided within the cavity portions 4, which are groove-shaped and are provided in the side face of the step-shaped portion 2a.

Given that the metal portion 3 is made from the getter metal material, any gas molecules inside the container (between the recess portion 2 and the lid 8) sealing the electronic component 6 are adsorbed by the metal portion 3. As a result, an improved vacuum degree is obtained within the container. Accordingly, the reliability, functionality, and the like of the electronic component 6 housed within the container (the electronic component 6 hermetically sealed in the electronic device) are easily improved.

In the present embodiment, the cavity portion 4 provided in the side face of the step-shaped portion 2a is filled by an unfired getter metal material and is then fired. As such, the getter metal material becomes a sintered body. At least one component of this sintered body and ceramics of the insulating substrate 1 forming the inner surface of the recess portion 2 is diffused into the other at the interface and in the vicinity of the interface, for mutual bonding. As a result, the metal portion 3 that is made from the sintered body of the getter metal material is held firmly onto the inner surface of the recess portion 2 and is unlikely to peel away. In addition, given that the metal portion 3 itself involves grains of the getter metal material forming necks by joining each other, a portion of the metal portion 3 is unlikely to fall.

Accordingly, for example, electrical shorts between the wiring conductor 5 and the electronic component 6, and the like caused by crumbling or peeling of metal particles and a detector of an infrared sensor element becoming obstructed by the metal particles may be prevented. In addition, given that the metal portion 3 is inlaid within the cavity portion 4 (a groove-shaped portion) positioned in the side face of the step-shaped portion 2a, the space within the recess portion 2 may be more effectively utilized for housing the electronic component 6. In other words, having the metal portion 3 inside the recess portion 2 enables the package for housing the electronic component and the electronic device to be provided as more effective in terms of miniaturization.

Figure 2:
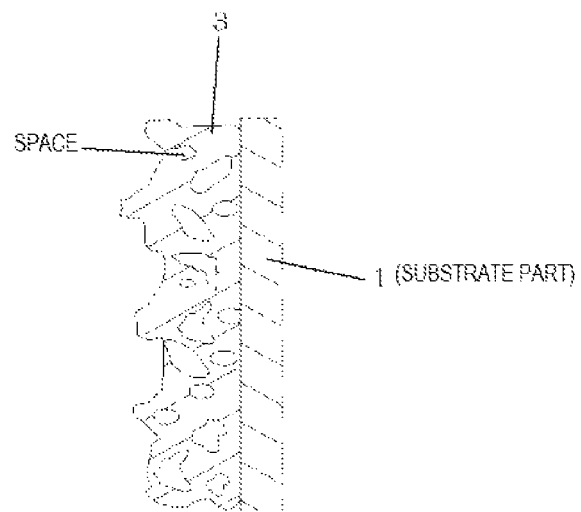
FIG. 2 is a cross-sectional view illustrating a magnification of key portions of the package for housing the electronic component and the electronic device illustrated in FIGS. 1A and 1B.

Here, FIG. 2 is a cross-sectional view illustrating a magnification of key portions of the package for housing the electronic component and the electronic device illustrated in FIGS. 1A and 1B. In FIG. 2, elements identical to FIGS. 1A and 1B are given identical reference signs. The sintered body of the getter metal material forming the metal portion 3 is, for example, mutually integrated sintered grains of the getter metal material, and is directly bonded to the inner surface of the recess portion 2.

That is, the metal portion 3 is a sintered body of the getter metal material that is directly bonded to the recess portion 2. As such, the strength of the getter metal material itself, making up the metal portion 3, and the bonding strength between the metal portion 3 and the recess portion 2, are large in comparison to that of conventional examples.

As a result, a piece of the metal portion 3 (getter metal material) is effectively prevented from crumbling, or peeling away. Also, for example, shorts or the like between electrodes of the electronic component 6 are effectively prevented.

In addition, according to an electronic device obtained by sealing the electronic component 6 in such a package for housing the electronic component, an electronic device having high long-term reliability in terms of electric performance may be provided.

In a situation where the insulating substrate 1 forming the inner surface of the recess portion 2 and the metal portion 3 are bonded by diffusion, mutual diffusion may occur between the components of the two elements (metal material such as aluminum oxide and later-described titanium). In such a situation, this mutual diffusion enables the strength of the bond between the insulating substrate 1 and the metal portion 3 to be improved, and enables peeling of the metal portion 3 from the insulating substrate 1 to be more effectively prevented.

Here, the above-described diffusion of the components between the insulating substrate 1 and the metal portion 3 at the interface and in the vicinity of the interface may occur from either element into the other. For example, the aluminum oxide component of the insulating substrate 1 may diffuse into the metal portion 3, and the material of the metal portion 3 (the later-described titanium and the like) may diffuse into the insulating substrate 1. The getter metal material forming the metal portion 3 provided on the inner surface of the recess portion 2 is able to effectively adsorb gas molecules as described above, and is a chemically active metal material. Specifically, the material may be titanium (Ti), zirconium (Zr), iron (Fe), vanadium (V), and the like. A metal powder having at least one type of these metal materials as a main component is kneaded with an organic solvent and a binder and the like to create a metal paste. The metal paste is applied onto a surface (a part constituting the inner surface of the recess portion 2) of the ceramic green sheets constituting the insulating substrate 1. Upon simultaneous firing with the ceramic green sheets and the like, the getter metal material adheres to the inner surface of the recess portion 2. The metal portion 3, formed from a sintered body of the getter metal material, is directly bonded to the inner surface of the recess portion 2. Here, the application of the metal paste onto the ceramic green sheets is performed using a printing method, such as a screen printing method, for example. The metal portion 3 may be provided in the cavity portion 4 on the side face of the step-shaped portion 2a as follows. Specifically, a groove portion constituting the cavity portion 4 is provided in a groove shape using a method such as mechanical punching processing, grinding, or laser processing, on a position serving as the side face of the step-shaped portion 2a in the ceramic green sheets constituting the insulating substrate 1. The metal paste constituting the metal portion 3 is printed and fills the interior of the groove portion, and simultaneous firing is performed. In addition, before forming the subset of the ceramic green sheets into the frame shape, a through-hole is provided at a position serving as the inner circumference of the step-shaped portion 2a of the recess portion 2. Punching processing may be performed after the above-described metal paste is filled in this through-hole.

In such a situation, a hole is formed in a green sheet. The hole is then filled with the metal paste having the getter metal material as a main component, and the metal paste is dried in an oven or the like. Next, the green sheet and the metal paste are punched out so that the hole filled with the metal paste is traversed longitudinally. As such, the step-shaped portion 2a is formed and the metal paste is exposed on the side face of the step-shaped portion 2a. The punching out may also be performed using processing with a metal mold, a laser, and the like.

In a situation where at least one piece of the metal portion 3 is positioned within the cavity portion 4, as in the example of the embodiment, the space within the recess portion 2 (the container) is more effectively usable for housing the electronic component 6 and the like. In addition, the bonding surface area between the metal portion 3 and the insulating substrate 1 is made larger, which has an advantage in that the bonding strength is increased. Accordingly, this approach is more effective in terms of miniaturization of the package for housing the electronic component and the like.

Here, the insulating substrate 1 may also be provided with a heating part (not illustrated) in order to heat the metal portion 3 positioned on the inner surface of the recess portion 2. This is done in order to enable effective removal by heating of an oxide film, in a situation where an oxide film or the like occurs on the surface of the getter metal material forming the metal portion 3. As a result, this removal by heating of the oxide film enables the effect of gas molecule adsorption by the metal portion 3 to be improved. For considerations of enhancing the improvement to the effectiveness of activity by removing the oxide film and the like, the above-described heating temperature for the surface of the getter metal material is preferably from 250 to 500° C.

The above-described heating part is, for example, an electric heater performing resistance heating. A material having relatively high electric resistance (resistivity) such as tungsten among the metal material, for example, constituting the wiring conductor 5 is used as the electric heater. The electric heater may be provided on the insulating substrate 1 by a similar method as the wiring conductor 5. In addition, a connection conductor (not illustrated) may be provided on the insulating substrate 1 and the like in order to supply a current from an external power supply to the electric heater. The connection conductor may be, for example, formed using a similar method to that of the wiring conductor 5 using a similar metal material to that of the wiring conductor 5.

In addition, the method of enhancing the improvement to the effectiveness of activity by removing the oxide film and the like may involve heating at the same time as the heating for reflow performed upon an element being mounted on the recess portion surface. Also, in a situation where the lid is transparent, processing may be performed with a laser after sealing.

In consideration of gas molecule adsorption within the recess portion 2 (the container), the metal portion 3 preferably has a large volume. However, the metal portion 3 having a large volume reduces the space for accommodating the electronic component 6 within the recess portion 2. Conversely, there is a possibility that miniaturization of the recess portion 2, that is, miniaturization of the package for housing the electronic component and the electronic device, may become difficult when accommodating the electronic component 6 having a fixed size. In consideration of these conditions, and of productivity, costs, and the like, the entirety of the metal portion 3 is more preferably contained within the cavity portion 4 on the side face of the step-shaped portion 2a.

In addition, the example of FIGS. 1A and 1B may be interpreted as an example in which the metal portion 3 is contained within the cavity portion 4. In such a situation, the space within the cavity portion 4 is more effectively utilized for disposing the metal portion 3. As a result, the miniaturization of the package for housing the electronic component and the electronic device, for example, is more easily accomplished.

However, in an aspect where the entirety of the metal portion 3 is accommodated within the cavity portion 4, the cavity portion 4 need not necessarily be filled by the metal portion 3. For example, in an example where the cavity portion 4 is provided in a groove shape, such as the example of FIGS. 1A and 1B, the metal portion 3 may also be provided in a layer shape along the inner circumferential surface of the groove (the cavity portion 4). Given that the ratio of bonding surface area between the metal portion 3 and the inner circumferential surface of the groove (the cavity portion 4) is greater in comparison to the volume of the metal portion 3, the reliability of the bond between the metal portion 3 and the insulating substrate 1 is high.

In addition, the example of FIGS. 1A and 1B has the cavity portion 4 positioned on the side face of the step-shaped portion 2a, which is on the side face of the recess portion 2, and the metal portion 3 is positioned within this cavity portion 4. In such a situation, the step-shaped portion 2a is partly formed by the metal portion 3. As a result, the surface area of the package for housing the electronic component and the electronic device, as seen in a plan view that includes the step-shaped portion 2a, may be constrained to be small, which has the advantage of enabling miniaturization of the package for housing the electronic component and the electronic device.

The metal portion 3 may also be provided so as to extend from within the cavity portion 4 across the inner surface of the recess portion 2, such as the side face, or bottom face. In such a situation, the bonding surface area between the metal portion 3 and the inner surface of the recess portion 2 is increased, which enables improvements to the bonding strength between the two components. In addition, the volume of the metal portion 3 as a whole is made larger, which increases the amount of gas that may be adsorbed.

Here, in the example of FIGS. 1A and 1B, the cavity portion 4 is preferably large, within a range that enables prevention of electrical shorts between the metal portion 3 and the wiring conductor 5 provided on the top face of the step-shaped portion 2a. The size of the cavity portion 4 signifies, in terms of the groove-shaped cavity portion 4 for example, the volume of the space between an opening portion and the inner surface of the cavity portion 4. In a situation where the groove-shaped cavity portion 4 is fan-shaped as seen in a plan view, increasing the radius thereof increases the size of the cavity portion 4. Here, the distance between the cavity portion 4 and the wiring conductor 5 may be a distance within a range ensuring good electrical insulation between the wiring conductor 5 and the metal portion 3 within the cavity portion 4.

Upon providing the wiring conductor 5 on the top face of the step-shaped portion 2a, which has a polygonal frame shape, such as a quadrilateral frame shape, as seen in a plan view, in a situation where the cavity portion 4 is positioned on the side face of the step-shaped portion 2a, the cavity portion 4 is preferably positioned on a corner portion of a top face of the polygonal frame shape. This situation has an advantage in terms of ensuring electrical insulation between the wiring conductor 5 and the metal portion 3. This is due to the space relative to the wiring conductor 5 at the corner portion of the top face being comparatively large.

Here, the dimensions of the metal portion 3 (for example, the radius of the fan-shaped metal portion 3 and the like) may be comparatively large at the corner portion of the top face. Likewise, the dimensions of the metal portion 3 may be comparatively small at an edge portion. In such a situation, electrical insulation properties between the metal portion 3 and the wiring conductor 5 may be increased while comparatively increasing a volume of the metal portion 3.

In addition, in order to increase the surface area of the getter metal material within limited housing space (the space between the recess portion 2 and the lid 8), the metal portion 3 is preferably made porous (with multiple holes in the surface or the like, that is, with spaces). The size of each hole may be from 10 to 150 µm, given the premise that the gas molecules being adsorbed easily pass through the holes. In addition, in terms of a porosity degree, the porosity is preferably on a level that does not cause shorts (does not break) upon receiving an impact or the like. The metal portion 3 preferably has a volume made up of space on the order of 30 to 60% of the total. In addition, the spaces are preferably continuous with each other.

In order to make the metal portion 3 porous, an organic substance that does not dissolve into the binder and the solvent and remains as solid may be added into the metal paste forming the metal portion 3, for example. This organic substance is preferably an organic material that vaporizes and vanishes during firing, such as a polypropylene polymer, an ammonium carbamate, or an acrylic binder having high degradability. The spaces in the metal portion 3 are formed by having this organic substance vaporize during firing processing. In addition, a foaming material such as a carbonate or a vinyl compound may be mixed into the binder, for example, and the spaces may also be formed by this material producing gas during firing.

Figure 3A:
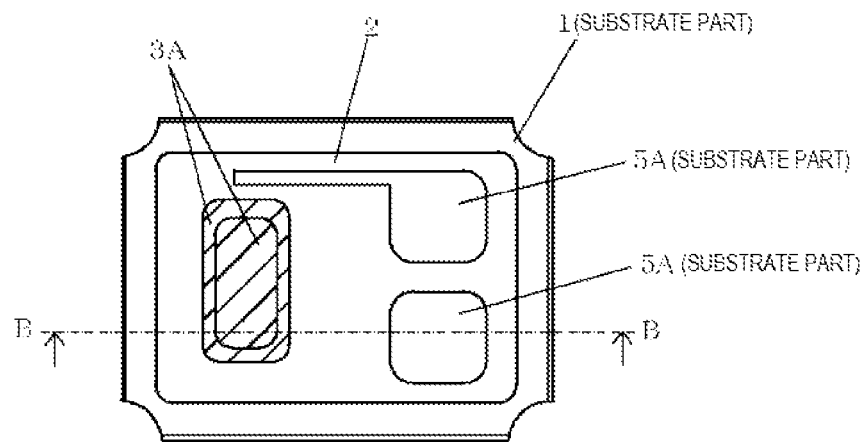
FIG. 3A is a plan view illustrating a package for housing an electronic component and an electronic device of a second embodiment of the present invention.
Figure 3B:
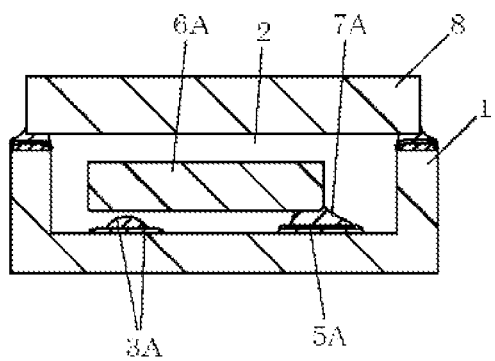
FIG. 3B is a cross-sectional view taken along line B-B of FIG. 3A.

FIG. 3A is a plan view diagram illustrating a package for housing an electronic component and an electronic device of a second embodiment of the present invention. FIG. 3B is a cross-sectional view taken along line B-B of FIG. 3A. In FIGS. 3A and 3B, elements identical to FIGS. 1A and 1B are given identical reference signs. Here, the electronic component and the lid are omitted from FIG. 3A in order to facilitate visibility.

In the package for housing the electronic component and the electronic device of the second embodiment, a metal portion 3A is provided on a bottom face of the recess portion 2. In addition, a side face of the recess portion 2 may have a step-shaped portion in this example. A wiring conductor 5A, which is, for example, a metallization layer of tungsten or the like, is provided on the bottom face of the recess portion 2. A substrate part is formed by the insulating substrate 1 and the wiring conductor 5A (the metallization layer). A conductive material 7A, which is electrically connected to an electronic component 6A and to the wiring conductor 5A, is an adhesive, such as a conductive adhesive, for example. The electronic component 6A hermetically sealed in the package for housing the electronic component of the second embodiment is, for example, a piezoelectric element such as a crystal oscillation element. In addition, the electronic device formed by hermetically sealing the electronic component 6A, which is a piezoelectric element or the like, in the package for housing the electronic component is a piezoelectric device such as a crystal oscillator. Aside from these points, the package for housing the electronic component and the electronic device of the second embodiment are similar to the package for housing the electronic component and the electronic device of the first embodiment. The points of similarity are omitted from the following explanations.

The metal portion 3A is similar to the metal portion 3 of the first embodiment, aside from being provided on the bottom face of the recess portion 2. That is, a getter metal material of titanium or the like is provided on the bottom face of the recess portion 2 of the insulating substrate 1. The metal portion 3A is provided as a sintered body of the getter metal material that is directly bonded to the surface of the insulating substrate 1. In this situation, the metal portion 3A also uses a similar getter metal material as the first embodiment and may be provided using a similar method. Here, in the second embodiment, the metal paste (titanium or the like) is printed onto a portion constituting the bottom face of the recess portion 2 in the ceramic green sheets constituting the insulating substrate 1.

The wiring conductor 5A is provided on the bottom face of the recess portion 2, at a position facing an electrode provided on a corner or the like of a main surface of the electronic component 6A, which is a piezoelectric element or the like. As a result, the electrodes of the electronic component 6A and the wiring conductor 5A face each other, and are electrically and mechanically connected to each other via the conductive material 7A, which is a conductive adhesive or the like.

The electronic component 6A housed within the recess portion 2 is electrically connected to the wiring conductor 5A. The recess portion 2 is closed by the lid 8. In this way, the electronic device such as a crystal oscillator is formed.

In the package for housing the electronic component and the electronic device of the second embodiment, the metal portion 3A made from the getter metal material is provided on the inner surface of the recess portion 2. As such, gas molecules within the container formed between the recess portion 2 and the lid 8 are effectively adsorbed by the metal portion 3A. As a result, the vacuum degree within the container is high. This high vacuum degree enables the electronic device to be manufactured as a crystal oscillation element having excellent oscillation functionality or the like.

In addition, in the package for housing the electronic component and the electronic device of the second embodiment, the metal portion 3A is also a sintered body of the getter metal material. In addition, given that this sintered body is formed by simultaneous firing with the insulating substrate 1, the metal portion 3A may be effectively prevented from partly peeling away from the insulating substrate 1. Furthermore, the sintered body of the getter metal material forming the metal portion 3 is mutually integrated sintered grains of the getter metal material. Given that the grains in the getter metal material are joined to each other by forming necks, a portion of the metal portion 3 is unlikely to fall.

In addition, the metal portion 3A provided on the bottom face of the recess portion 2 has functionality of preventing mechanical breakage (termed functionality as a bump portion) of the crystal resonator serving as the electronic component 6A mounted in the recess portion 2. That is, despite deflection occurring in a piezoelectric vibration plate (the crystal oscillation element serving as the electronic component 6A) because of an external impact, such as a fall of the electronic equipment in which the electronic device is mounted, the deflection amplitude of the piezoelectric vibration plate may be reduced by the metal portion 3A acting as the bump portion provided in order to prevent breakage of the piezoelectric vibration plate. As a result, the piezoelectric vibration plate is prevented from hitting the bottom face of the recess portion 2 and the like. In this embodiment, replacing this bump portion with the getter metal material makes peeling difficult, enables effective activity in the space within the cavity (the recess portion 2), and enables the package for housing the electronic component and the electronic device to be obtained as capable of hermetic sealing with a high vacuum degree.

Figure 4:
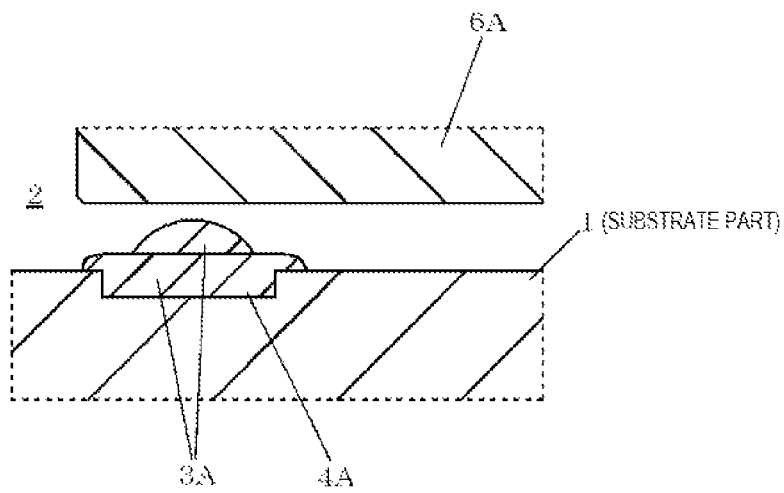
FIG. 4 is a cross-sectional view illustrating a modified example of key portions of the package for housing the electronic component and the electronic device illustrated in FIGS. 3A and 3B.

FIG. 4 is a cross-sectional view illustrating a modified example of key portions of the package for housing the electronic component and the electronic device illustrated in FIGS. 3A and 3B. In FIG. 4, elements identical to FIGS. 3A and 3B are given identical reference signs. The example illustrated in FIG. 4 has a cavity portion 4A on the bottom face of the recess portion 2. In addition, the metal portion 3A is not entirely inserted into the cavity portion 4A, but includes a portion that protrudes outward from the cavity portion 4A. In other words, the cavity portion 4A is filled by a portion of the metal portion 3A, and the remainder of the metal portion 3A is positioned outside from the cavity portion 4A. In such a situation, given that the metal portion 3A is also provided on the inner surface of the recess portion 2, the gas molecules within the container are more effectively adsorbed by the metal portion 3A.

In addition, in the example of FIG. 4 (the modified example), a piece of the metal portion 3A is positioned within the cavity portion 4A. As such, similarly to the first embodiment, the space within recess portion 2 (the container) is more effectively useable for housing the electronic component 6A. In addition, the bonding surface area between the metal portion 3A and the insulating substrate 1 is made larger. This large bonding surface area has an advantage in that the bonding strength is increased.

Here, in the examples of FIGS. 3A and 3B and FIG. 4, the metal portion 3A has a two-layer structure including a lower layer and an upper layer (no reference signs). In such a situation, the metal paste of the getter metal material serving as the metal portion 3A, for example, is divided in two for printing. As a result, the printing thickness of the metal paste for each printing is constrained to be smaller. This printing simplifies printing and increases workability. In addition, given that each printing thickness is comparatively thin, a failure such as mistaken peeling of the printed metal paste is more effectively prevented. In other words, the formation of the metal portion 3A serving as a bump portion of comparatively high height is made easier.

Figure 5A:
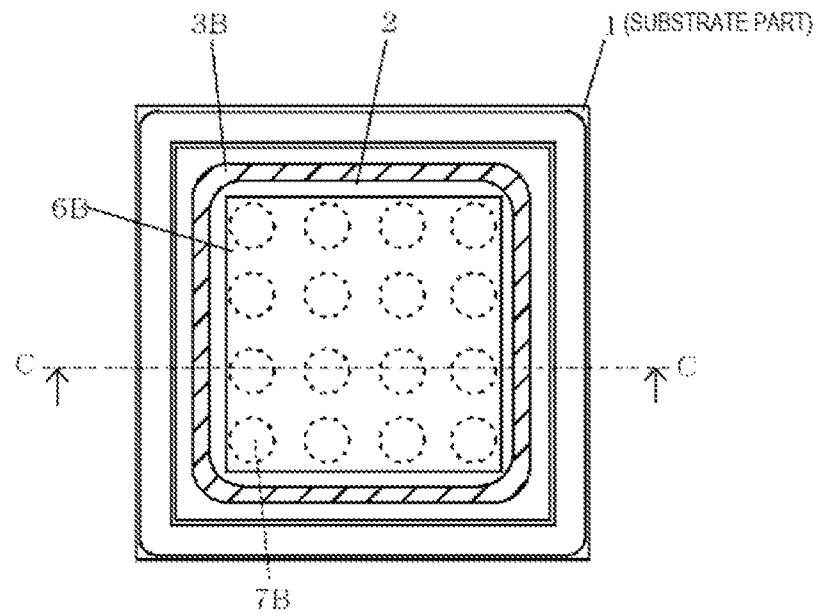
FIG. 5A is a plan view illustrating a modified example of the package for housing the electronic component and the electronic device of the second embodiment of the present invention.
Figure 5B:
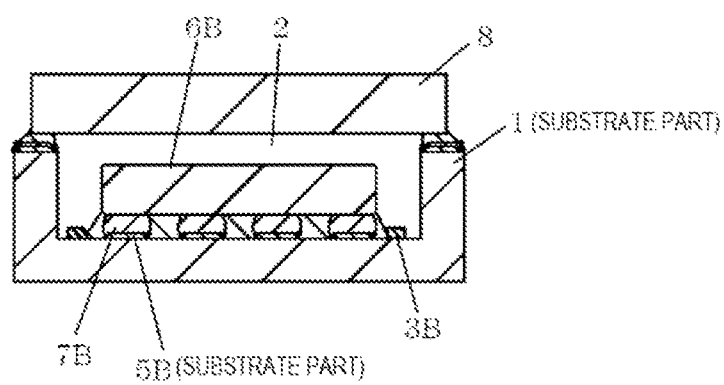
FIG. 5B is a cross-sectional view taken along line C-C of FIG. 5A.

FIG. 5A is a plan view diagram illustrating a modified example of the package for housing the electronic component and the electronic device from the second embodiment. FIG. 5B is a cross-sectional view taken along line C-C of FIG. 5A. In FIGS. 5A and 5B, elements identical to FIGS. 1A and 1B and to FIGS. 3A and 3B are given identical reference signs. Here, the lid is omitted from FIG. 5A in order to facilitate visibility.

In the package for housing the electronic component and the electronic device of this modified example, a metal portion 3B is provided on the bottom face of the recess portion 2. In addition, a side face of the recess portion 2 does not have a step-shaped portion. Wiring conductors 5B are provided on the bottom face of the recess portion 2. Conductive materials 7B, which are electrically connected to the electronic component 6 and to the wiring conductors 5B, are an adhesive, for example a brazing material such as a solder, a conductive adhesive, or the like. An electronic component 6B that is hermetically sealed into the package for housing the electronic component of this modified example is, for example, a semiconductor element or the like having a plurality of electrodes arranged on a main surface of an electronic component body (no reference sign). The semiconductor element is a semiconductor integrated circuit element (IC), an optical semiconductor device, a semiconductor sensor element (including what is termed a MEMS element) or the like. The electronic component 6B is mounted with the main surface on which the electrodes are arranged being face down. That is, the electronic component 6B is housed within the recess portion 2 by flip-chip mounting. The electronic device obtained by hermetically sealing the electronic component 6B, which is a semiconductor element or the like, in the package for housing the electronic component is a semiconductor device, a sensor device, an imaging device, a light emitting device, or the like. Aside from these points, the package for housing the electronic component and the electronic device of this modified example are similar to the package for housing the electronic component and the electronic device of the first and second embodiment. The points of similarity are omitted from the following explanations.

The metal portion 3B is provided on the bottom face of the recess portion 2, similarly to the metal portion 3A of the second embodiment. However, the form of arrangement is a frame shape surrounding a mounting portion of the electronic component 6B, mounted by flip-chip mounting as seen in a plan view. That is, for example, the metal portion 3B is provided by printing a paste of a metal material similar to that used for the second embodiment onto a main surface of the ceramic green sheets constituting the insulating substrate 1 at positions surrounding the mounting portion of the electronic component 6B on the insulating substrate 1, and performing simultaneous firing.

The wiring conductor 5B is provided on the bottom face of the recess portion 2 at a position facing the electrodes provided on the main surface of the electronic component 6B and aligned horizontally and vertically or the like, the electronic component 6B being mounted by flip-chip mounting. As a result, the electrodes of the electronic component 6B and the wiring conductor 5B face each other, and are electrically and mechanically connected to each other via a conductive material 7B, which is a tin-silver-based solder or the like, for example.

The electronic component 6B housed within the recess portion 2 is electrically connected to the wiring conductor 5B. The recess portion 2 is closed by the lid 8. In this way, the electronic device such as semiconductor device is formed.

In the package for housing the electronic component and the electronic device of this modified example, the metal portion 3B formed from a sintered body of the getter metal material is also provided on the inner surface of the recess portion 2. As such, this metal portion 3B enables gas molecules within the container formed between the recess portion 2 and the lid 8 to be effectively adsorbed. For this reason, the vacuum degree within the container is high, which enables the electronic device to be created with excellent long-term reliability for an IC, with excellent detection accuracy of a physical quantity such as acceleration by a sensor element (MEMS element).

In addition, in the package for housing the electronic component and the electronic device of this modified example, the metal portion 3B is also formed by a sintered body of the getter metal material. As such, the metal portion 3B may be effectively prevented from partly peeling from the insulating substrate 1 forming the inner surface of the recess portion 2. In addition, in this situation, the getter metal material may also be joined and formed by simultaneous firing with the insulating substrate 1. As a result, the strength of the bond between the metal portion 3B and the insulating substrate 1 is further improved.

Here, for example, upon filling the space between the electronic component 6B and the bottom face of the recess portion 2 with a resin material (termed an underfill), the metal portion 3B of this modified example also has a functionality of preventing this resin material from flowing out to the exterior (functionality of serving as a dam). The package for housing the electronic component and the electronic device requiring this functionality as a dam at any position has the metal portion 3B also fulfill this functionality. As a result, this functionality may lead to an advantage in terms of miniaturization, improvements to functionality, and the like.

Figure 6A:
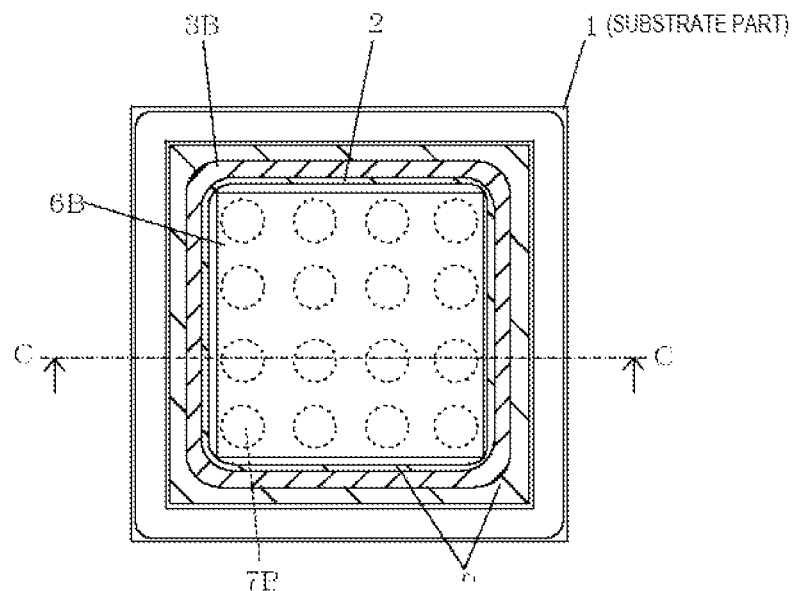
FIG. 6A is a plan view illustrating a modified example of FIGS. 5A and 5B.
Figure 6B:
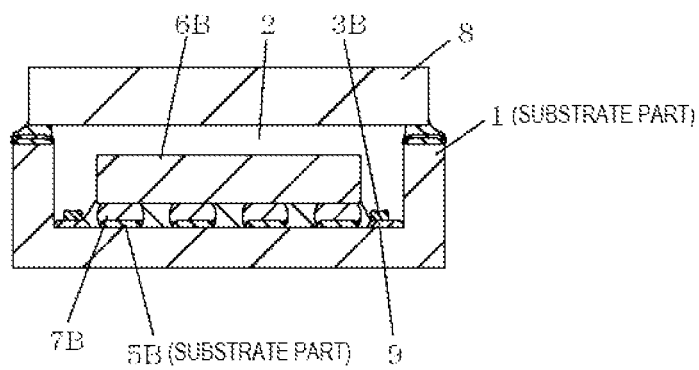
FIG. 6B is a cross-sectional view taken along line C-C of FIG. 6A.
Figure 7:
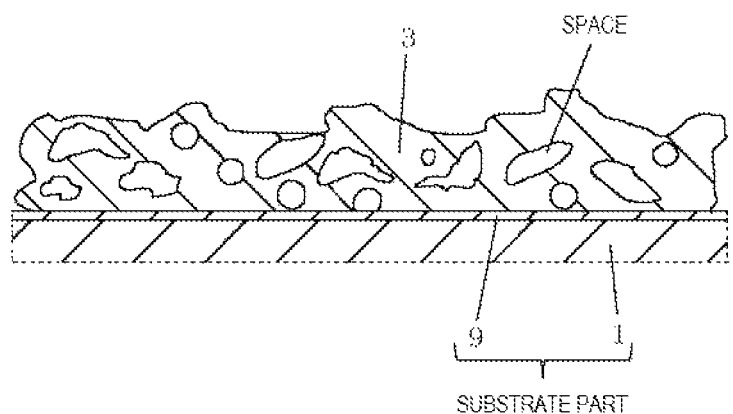
FIG. 7 is a cross-sectional view illustrating a magnification of key portions of the package for housing the electronic component and the electronic device illustrated in FIGS. 6A and 6B.

FIG. 6A is a plan view illustrating a modified example of FIGS. 5A and 5B. FIG. 6B is a cross-sectional view taken along line C-C of FIG. 6A. In addition, FIG. 7 is a cross-sectional view illustrating a magnification of key portions of FIGS. 6A and 6B. In FIGS. 6A and 6B and in FIG. 7, elements identical to FIGS. 1A and 1B to FIGS. 5A and 5B are given identical reference signs. Here, the lid is omitted from FIG. 6A in order to facilitate visibility.

The package for housing the electronic component and the electronic device of this modified example differ from that of the example illustrated in FIGS. 5A and 5B in that the metal portion 3 is provided on a metallization layer 9 that is provided on the bottom face of the recess portion 2, and are otherwise similar thereto. The points of similarity with the example of FIGS. 5A and 5B are omitted from the following explanations.

The metallization layer 9 provided on the bottom face of the recess portion 2 has, for example, a comparatively wide surface area for grounding or the like. The insulating substrate 1, the wiring conductor 5B, and the metallization layer 9 on the bottom face of the recess portion 2 make up a substrate part. The metal portion 3, made up of the sintered body of the getter metal material, mutually diffuses with the metallization layer 9 and is bonded with the metallization layer 9.

In the package for housing the electronic component and the electronic device of this modified example, the metal portion 3B is also made up of the sintered body of the getter metal material that is directly bonded to the metallization layer 9 provided on the inner surface of the recess portion 2. As such, the metal portion 3B may be effectively prevented from peeling away from the metallization layer 9.

In addition, in this situation, the getter metal material may also be formed by simultaneous firing of the metallization layer 9 and the insulating substrate 1. As a result, the strength of the bond between the metal portion 3B and the substrate part (the metallization layer 9) is improved. In a situation where the getter metal material is formed by simultaneous firing of the metallization layer 9 and the insulating substrate 1, the strength of the bond between the metal portion 3B and the substrate part (the metallization layer 9) is improved. Here, in this situation, similarly to the above-described example, either one of the components of the insulating substrate 1 and the metal portion 3 diffuses into the other.

In this situation, mutual diffusion of components of the metal portion 3 and the metallization layer 9 into each other preferably occurs during firing. As a result, the strength of the bond between the metal portion 3 and the metallization layer 9 is improved, which enables peeling of the metal portion 3 to be more effectively prevented.

Here, the diffusion of the components of the metal portion 3 and the metallization layer 9 into each other may occur from either element into the other. For example, the components of the metallization layer 9 such as tungsten may diffuse into the metal portion 3. Conversely, the material of the metal portion 3 (the previously-described titanium or the like) may also diffuse into the metallization layer 9. The package for housing the electronic component and the electronic device of the present invention is not limited to the examples of the above embodiments and the modified examples. Various modifications are also possible within the scope of the main points of the present invention. For example, the cavity portion 4 is not limited to the example of FIGS. 1A and 1B. The cavity portion 4 may be positioned on the bottom face of the recess portion 2. Alternatively, the cavity portion 4 may be provided on the side face of the recess portion 2 without the step-shaped portion 2a. In addition, a plurality of aspects may be combined. For example, in the package for housing the electronic component having the step-shaped portion 2a on the side face of the recess portion 2, another cavity portion (not illustrated) may be provided on the bottom face of the recess portion 2 or the like in addition to the side face of the step-shaped portion 2a. Another metal portion (not illustrated) may also be positioned within this cavity portion.

In addition, the metal portion 3 need not fill the cavity portion 4. For example, the metal portion (not illustrated) in a layer shape along the surface of the cavity portion 4, which is groove-shaped as illustrated in FIGS. 1A and 1B, may have an attached shape (an aspect of a castellation shape) (not illustrated). In addition, a piece of the metal portion 3 may protrude outward from the cavity portion 4. In this situation, there is an advantage in that the volume of the metal portion 3 present within the recess portion 2 is made larger.

In addition, the metal portion 3 may be provided on a plurality of surfaces, including the side face and the bottom face of the inner surface of the recess portion 2, and furthermore on the side face of the step-shaped portion, and the like. The cavity portion 4 may also be provided on each surface.

In addition, the metal portion 3 may be provided as one of an alignment mark used upon housing the electronic component 6 within the recess portion 2 and an index mark used upon performing electrical connection between the wiring conductor 5 and the electronic component 6. In addition, the metal portion 3 may simply be provided on the inner surface of the recess portion 2, on the side wall and the like. In such a situation, the metal portion 3 is provided at a position (the side face of the recess portion 2 or the like) increasing electrical insulation properties between the wiring conductor 5 and the electronic component 6, and the metal portion 3.

REFERENCE NUMBER

1 Insulating substrate
2 Recess portion
3, 3A, 3B Metal portion
4, 4A Cavity portion
5, 5A, 5B Wiring conductor
6, 6A, 6B Electronic component
7, 7A, 7B Conductive material
8 Lid
9 Metallization layer (of bottom face of recess portion)

The invention claimed is:

1. A package for housing an electronic component, comprising:
an insulating substrate made from a ceramic sintered body, the insulating substrate comprising a recess portion, and a wiring conductor provided on the insulating substrate;
a metal portion made from a sintered body of a getter metal material directly bonded to the recess portion; and
a cavity portion provided on an inner surface of the recess portion, wherein the metal portion is positioned within the cavity portion and fills the cavity portion.

2. The package for housing an electronic component according to claim 1, wherein the metal portion is accommodated in entirety within the cavity portion.

3. The package for housing an electronic component according to claim 1, wherein the metal portion is provided so as to extend from inside the cavity portion to the inner surface of the recess portion.

4. The package for housing an electronic component according to claim 1, wherein the inner surface of the recess portion comprises a side face and a bottom face, the side face comprising a step-shaped portion, and the cavity portion is provided on a side face of the step-shaped portion.

5. The package for housing an electronic component according to claim 4, wherein the wiring conductor is provided on a top face of the step-shaped portion, the top face of the step-shaped portion is in a polygonal frame shape in a plane view, and the cavity portion is positioned in a corner of the top face in a plane view.

6. The package for housing an electronic component according to claim 1, wherein the inner surface of the recess portion comprises a side face and a bottom face, and the metal portion is provided on the bottom face of the recess portion.

7. The package for housing an electronic component according to claim 6, wherein the bottom face of the recess portion comprises a mounting portion for the electronic component, and the metal portion is provided on the bottom face of the recess portion and surrounds the mounting portion.

8. The package for housing an electronic component according to claim 1, wherein the metal portion is directly bonded to the inner surface of the recess portion.

9. The package for housing an electronic component according to claim 8, wherein in a vicinity of an interface between the metal portion and the inner surface of the recess portion, at least a component of either the metal portion or the inner surface of the recess portion is present in the other.

10. The package for housing an electronic component according to claim 1, wherein the metal portion is directly bonded to a metallization layer provided on the inner surface of the recess portion.

11. The package for housing an electronic component according to claim 10, wherein in a vicinity of an interface between the metal portion and the metallization layer, at least a component of either the metal portion or the metallization layer is present in the other.

12. An electronic device comprising:
the package for housing an electronic component according to claim 1; and
the electronic component housed within the recess portion.

* * * * *